(12) United States Patent
Fukushima et al.

(10) Patent No.: US 7,955,705 B2
(45) Date of Patent: Jun. 7, 2011

(54) ELECTRONIC DEVICE SUBSTRATE, METHOD FOR MANUFACTURING SUBSTRATE, COMPOUND USED FOR SUBSTRATE, METHOD FOR MANUFACTURING COMPOUND AND POLYMERIZATION INITIATOR INCLUDING COMPOUND

(75) Inventors: Hitoshi Fukushima, Suwa (JP);
Shinobu Yokokawa, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 669 days.

(21) Appl. No.: 11/739,837

(22) Filed: Apr. 25, 2007

(65) Prior Publication Data

US 2007/0259187 A1    Nov. 8, 2007

(30) Foreign Application Priority Data

May 8, 2006   (JP) ................... 2006-129311

(51) Int. Cl.
*B32B 15/04*    (2006.01)
(52) U.S. Cl. ....................................... 428/457
(58) Field of Classification Search .............. 428/457
See application file for complete search history.

(56) References Cited

U.S. PATENT DOCUMENTS

2003/0180966 A1* 9/2003 Abbott et al. ............. 436/518
2006/0219607 A1* 10/2006 Sato et al. ................. 209/221

FOREIGN PATENT DOCUMENTS

JP    A 7-077509     3/1995
JP    A 2006-242925  9/2006
JP    A 2006-242926  9/2006

OTHER PUBLICATIONS

K. Plunkett et al., "PNIPAM Chain Collapse Depends on the Molecular Weight and Grafting Density", Langmuir, vol. 22, 2006 pp. 4259-4266.
D. Li et al., "Thermosensitive Hairy Hybrid Nanoparticles Synthesized by Surface-Initiated Atom Transfer Radical Polymerization", Langmuir, vol. 22, 2006, pp. 3344-3351.
C. Xu et al., "Microchannel Confined Surface-Initiated Polymerization", Macromolecules, vol. 38, 2005, pp. 6-8.
F. J. Xu et al., "UV-Induced Coupling of 4-Vinylbenzyl Chloride on Hydrogen-Terminated Si(100) Surfaces for the Preparation of Well-Defined Polymer-Si Hybrids via Surface-Initiated ATRP", Macromolecules, vol. 38, 2005, 1573-1580.

(Continued)

*Primary Examiner* — Callie E Shosho
*Assistant Examiner* — Samir Shah
(74) *Attorney, Agent, or Firm* — Oliff & Berridge, PLC

(57) ABSTRACT

An electronic device substrate includes a substrate having at least one of a metal and a metal oxide on a surface thereof and an underlying layer having a compound expressed by a following general formula (1):

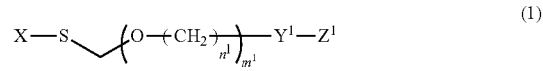

wherein X presents one of a hydrogen atom and a protecting group; $Y^1$ represents one of an oxygen atom, an alkylene group and —$N(R^1)$—, in which $R^1$ represents an alkyl group; $Z^1$ represents a polymerization initiating group; $n^1$ represents an integer from 1 to 4; and $m^1$ represents an integer from 1 to 15.

12 Claims, 1 Drawing Sheet

OTHER PUBLICATIONS

D. Xu et al., "Functionalization of Hydrogen-Terminated Silicon via Surface-Initiated Atom-Transfer Radical Polymerization and Derivatization of the Polymer Brushes", Journal of Colloid and Surface Science, vol. 279, 2004, pp. 78-87.

H. Ma et al., "'Non-Fouling' Oligo(ethylene glycol)-Functionalized Polymer Brushes Synthesized by Surface-Initiated Atom Transfer Radical Polymerization", Advanced Materials, vol. 16, No. 4, Feb. 2004, pp. 338-341.

* cited by examiner

ELECTRONIC DEVICE SUBSTRATE, METHOD FOR MANUFACTURING SUBSTRATE, COMPOUND USED FOR SUBSTRATE, METHOD FOR MANUFACTURING COMPOUND AND POLYMERIZATION INITIATOR INCLUDING COMPOUND

BACKGROUND

1. Technical Field

Several aspects of the present invention relate to an electronic device substrate, a method for manufacturing the substrate, a compound used for the substrate, a method for manufacturing the compound and a polymerization initiator including the compound.

2. Related Art

Currently, chemical sensors operating on the basic principles of electrochemistry have been studied and applied in a broad range of areas. One example for that is a glucose sensor used for measuring blood sugar level. In recent years, particularly, along with the progress of application technology concerning enzymes and proteins, functionalized electrodes having immobilized enzymes and proteins thereon have been used to facilitate highly sensitive and highly selective analyses of such physiologically active substances as enzymes and proteins.

In order to immobilize an enzyme or a protein on the functionalized electrode mentioned above, it is necessary in advance to form a film bonded to the enzyme or the like on a surface of the electrode. For example, in an immobilized enzyme electrode as known in the art, an underlying polymer film containing perfluoro polyethylene sulfonic acid is formed to deposit a selectively permeable film and an immobilized enzyme thereon (e.g. JP-A-7-77509). Additionally, there is known an electrode substrate in which an ester compound comprised of 2-bromo-2-methyl-propionic acid and 10-hydroxy-1-decanthiol has been bonded to an electrode surface (e.g. Advanced Materials, 2004, 16, No. 4, 338-341).

However, those electrodes use a methylene chain as a spacer. Accordingly, when the compound is bonded to the electrode surface, a minute insulating film tends to be formed due to a lateral intermolecular force between methylene chains. As a result, ionic permeability is hindered, so that ion fluxes as electric current cannot be detected.

JP-A-7-77509 is an example of related art.

Advanced Materials (2004, 16, No. 4 338-341) is a non-patent example of related art.

SUMMARY

Advantages of the present invention are to provide an electronic device substrate having high ionic permeability, a method for manufacturing the substrate, a compound used for the substrate, a method for manufacturing the compound, and a polymerization initiator including the compound.

Such advantages can be achieved by aspects and features of the invention described below.

An electronic device substrate according to a first aspect of the invention includes a substrate having at least one of a metal and a metal oxide on a surface thereof and an underlying layer having a compound expressed by a following general formula (1):

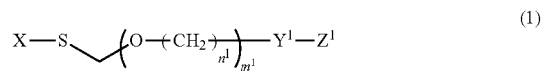

wherein X represents one of a hydrogen atom and a protecting group; $Y^1$ represents one of an oxygen atom, an alkylene group and —N($R^1$)—, in which $R^1$ represents an alkyl group; $Z^1$ represents a polymerization initiating group; $n^1$ represents an integer from 1 to 4; and $m^1$ represents an integer from 1 to 15.

In this manner, since a polyether chain is used as a spacer, the electronic device substrate can exhibit high ionic permeability.

In the electronic device substrate according to the first aspect, preferably, the compound expressed by the general formula (1) is bonded to the at least one of the metal and the metal oxide via a sulfur atom.

In this manner, since the metal and the sulfur atom form a covalent bond with each other, the compound of the general formula (1) is firmly and stably bonded to the substrate. Therefore, the electronic device substrate can exhibit reliable ionic permeability.

Additionally, in the electronic device substrate according to the first aspect, preferably, the metal is one of gold, silver and platinum.

In this manner, since the metal and the sulfur atom are covalently bonded to each other, the compound of the general formula (1) can be more firmly and stably bonded to the substrate. Thus, a stable underlying layer can be formed on the substrate.

Additionally, in the electronic device substrate according to the first aspect, preferably, the metal oxide is a transparent conductive metal oxide.

In this manner, the compound of the general formula (1) can be more firmly bonded to the substrate. Thus, a stable underlying layer can be formed on the substrate.

Additionally, in the electronic device substrate according to the first aspect, preferably, the polymerization initiating group $Z^1$ of the compound expressed by the general formula (1) has one of following structures (I), (II) and (III):

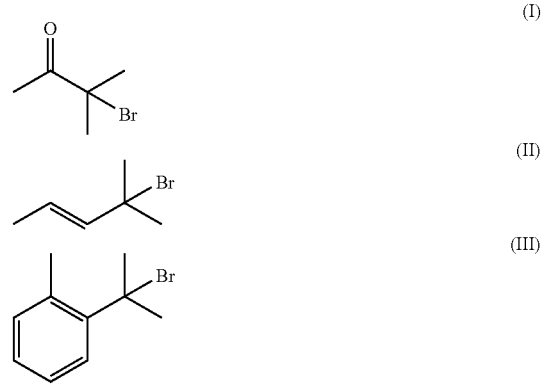

In this manner, since polymerization is promoted by the polymerization initiating group located at a molecular end of the compound, the electronic device substrate allows efficient initiation of polymerization.

Additionally, in the electronic device substrate according to the first aspect, preferably, the $n^1$ of the compound expressed by the general formula (1) is 2.

In this manner, since the —O—(CH$_2$)$_2$— is used as a spacer, electrons can be efficiently moved. Thus, the electronic device substrate can exhibit high ionic permeability.

According to a second aspect of the invention, a method for manufacturing an electronic device substrate includes contacting a compound expressed by a following general formula (1) with a substrate having at least one of a metal and a metal oxide on a surface thereof to form a metal-sulfur bond on the surface thereof, the general formula (1) being as follows:

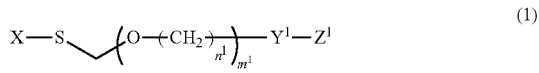
(1)

wherein X represents one of a hydrogen atom and a protecting group; Y$^1$ represents one of an oxygen atom, an alkylene group and —N(R$^1$)—, in which R$^1$ represents an alkyl group; Z$^1$ represents a polymerization initiating group; n$^1$ represents an integer from 1 to 4; and m$^1$ represents an integer from 1 to 15.

In this manner, a stable underlying layer can be easily formed on the substrate. Thus, the electronic device substrate can be manufactured in a short time.

In the above method according to the second aspect, preferably, the protecting group X of the compound expressed by the general formula (1) is expressed by a following formula:

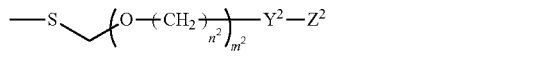

wherein Y$^2$ represents one of an oxygen atom, an alkylene group and —N(R$^2$)—, in which R$^2$ represents an alkyl group; Z$^2$ represents a polymerization initiating group; n$^2$ represents an integer from 1 to 4; and m$^2$ represents an integer from 1 to 15.

In this manner, since the compound can be bonded to the substrate in a state of a disulfide compound, a deprotection step is unnecessary. Thus, a stable underlying layer can be easily formed on the substrate. As a result, the electronic device substrate can be manufactured in a short time.

According to a third aspect of the invention, there is provided a compound expressed by a following general formula (1):

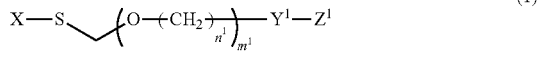
(1)

X represents one of a hydrogen atom and a protecting group; Y$^1$ represents one of an oxygen atom, an alkylene group and —N(R$^1$)—, in which R$^1$ represents an alkyl group; Z$^1$ represents a polymerization initiating group; n$^1$ represents an integer from 1 to 4; and m$^1$ represents an integer from 1 to 15.

In this manner, the above compound can be bonded to a metal via a sulfur atom and can initiate polymerization with the polymerization initiating group, as well as can be used in various fields, such as that of electronic devices.

Additionally, in the above compound according to the third aspect, preferably, the n$^1$ of the compound expressed by the general formula (1) is 2; the m$^1$ thereof is one of 3, 7 and 11; and the polymerization initiating group Z$^1$ thereof has a following structure:

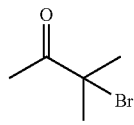

In this manner, polymerization can be efficiently initiated by the polymerization initiating group. Additionally, the compound can be used in various fields, such as that of electronic devices.

According to a fourth aspect of the invention, there is provided a method for manufacturing the compound according to the third aspect. The method includes reacting, in the presence of a base, a compound expressed by a following general formula (2) with a compound expressed by a following general formula (3), the general formula (2) being as follows:

(2)

X represents one of a hydrogen atom and a protecting group; Y$^1$ represents one of an oxygen atom, an alkylene group and —N(R$^1$)—, in which R$^1$ represents an alkyl group; L represents a leaving group; n$^1$ represents an integer from 1 to 4; and m$^1$ represents an integer from 1 to 15; and the general formula (3) being as follows:

Z$^1$-Q (3)

Z$^1$ represents a polymerization initiating group and Q represents a halogen atom.

In this manner, the compound according to the third aspect can be easily manufactured.

According to a fifth aspect of the invention, there is provided a polymerization initiator including the compound according to the third aspect.

In this manner, the polymerization initiator can be bonded to at least one of a metal and a metal oxide.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
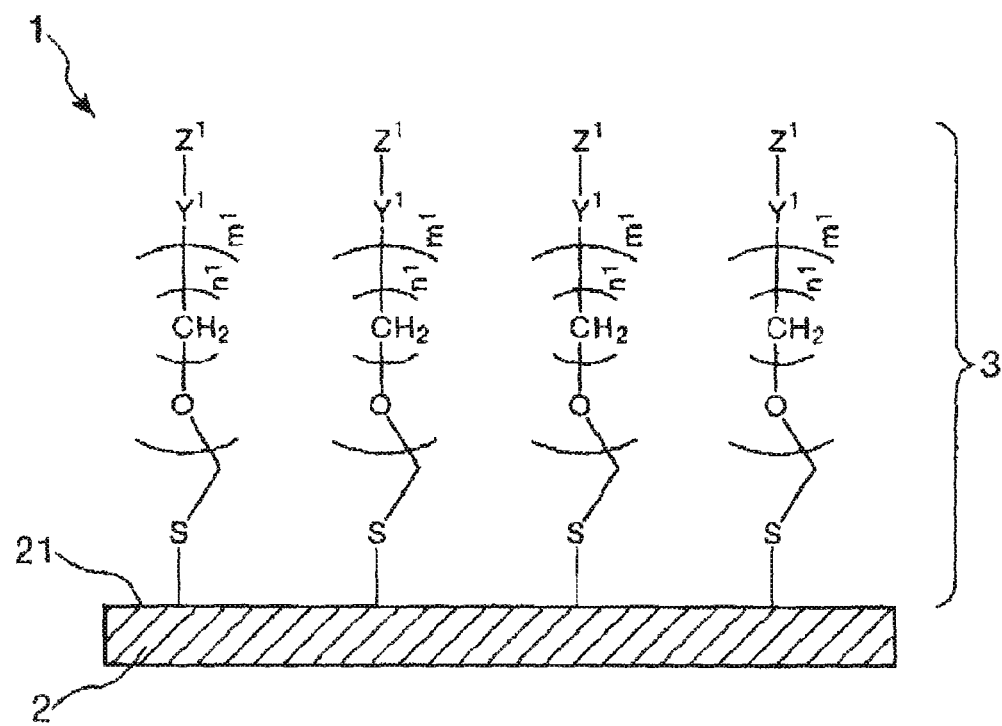
FIG. 1 is a schematic view of an electronic device substrate according to an embodiment of the invention.

Reference will now be made in detail to exemplary embodiments and examples of the invention.

Compound

First, a description will be given of a compound according to an embodiment of the invention. The compound according to the embodiment is expressed by a following general formula (1):

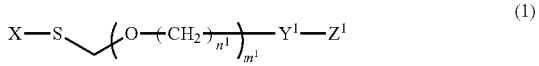

(1)

In the above formula, X represents one of a hydrogen atom and a protecting group; $Y^1$ represents one of an oxygen atom, an alkylene group and $-N(R^1)-$, in which $R^1$ represents an alkyl group; $Z^1$ represents a polymerization initiating group; $n^1$ represents an integer from 1 to 4; and $m^1$ represents an integer from 1 to 15.

As mentioned above, the X represents a hydrogen atom or a protecting group. The protecting group may be any one of protecting groups known in the art, such as an acetyl group, a thiosulfate group or a group expressed by the following structural formula:

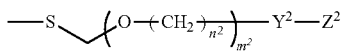

wherein $Y^2$ represents one of an oxygen atom, an alkylene group and $-N(R^2)-$, in which $R^2$ represents an alkyl group; $Z^2$ represents a polymerization initiating group; $n^2$ represents an integer from 1 to 4; and $m^2$ represents an integer from 1 to 15. The $Z^2$, $Y^2$, $R^2$, $m^2$ and $n^2$ are the same as the $Z^1$, $Y^1$, $R^1$, $m^1$ and $n^1$ in the general formula (1).

Among them, as a group used to manufacture an electronic device substrate to be described below, the group expressed by the above structural formula is preferred because it allows easy manufacturing of the electronic device substrate. In this manner, the compound of the general formula (1), which uses the group of the above structural formula as a protecting group, can be directly bonded to a substrate member via an S—S bond. Accordingly, a deprotection step for X is unnecessary. Therefore, the electronic device substrate can be easily manufactured.

In the general formula (1), $Y^1$ represents an oxygen atom, an alkylene group or $-N(R^1)-$. The alkylene group may have, for example, a carbon atom number of 1 to 20, preferably 1 to 10 and more preferably 1 to 5. Specifically, there may be mentioned a methylene group, an ethylene group, a butylene group, a hexylene group or the like. Additionally, the $R^1$ of the $-N(R^1)-$ represents an alkyl group. Specifically, there may be mentioned an alkyl group having a carbon atom number of 1 to 20, preferably, 1 to 10 and more preferably 1 to 5. More specifically, there may be used a methyl group, an ethyl group, a butyl group, a hexyl group or the like.

Among them, particularly, an oxygen atom is preferable. In this manner, the compound expressed by the general formula (1) can be easily obtained.

$Z^1$ represents a polymerization initiating group, which initiates polymerization.

The polymerization initiating group may be, for example, any one of those known in the art. More preferably, as shown below, there may be mentioned those each having an active group at an alpha position of a carbonyl double bond or a carbon-carbon double bond. For example, the more preferable polymerization initiating group may have one of the following structures (I), (II) and (III):

(I)

(II)

(III)

In this manner, polymerization is efficiently initiated by the active group at the alpha position of the carbonyl or carbon-carbon double bond. Accordingly, a polymer compound can be easily obtained. Particularly, the group having the above structure (I) is more preferable because it is easier to handle.

Furthermore, the $n^1$ representing an integer from 1 to 4 is preferably 2. In this manner, the compound expressed by the above general formula (1) can be easily obtained from polyethylene glycol. Additionally, since $-O-(CH_2)_2-$ is used as a spacer, electrons can be more efficiently moved.

Furthermore, the $m^1$ representing an integer from 1 to 15 is preferably 3, 7 or 11. In this manner, the compound expressed by the above general formula (1) can be easily obtained. Additionally, since a polyether chain is used as a spacer, electrons can be more efficiently moved.

With combinations of the above exemplified X, $Y^1$, $Z^1$, $n^1$ and $m^1$, further concrete examples of the compound expressed by the general formula (1) may include those having the following structures 1 to 9:

1

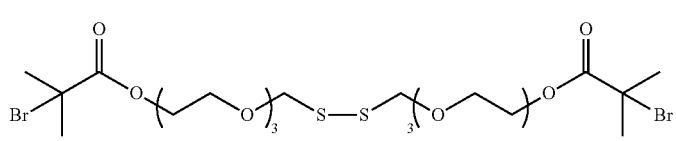

2

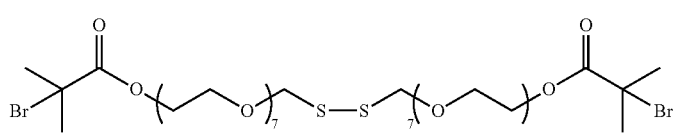

3

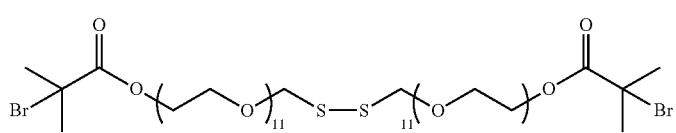

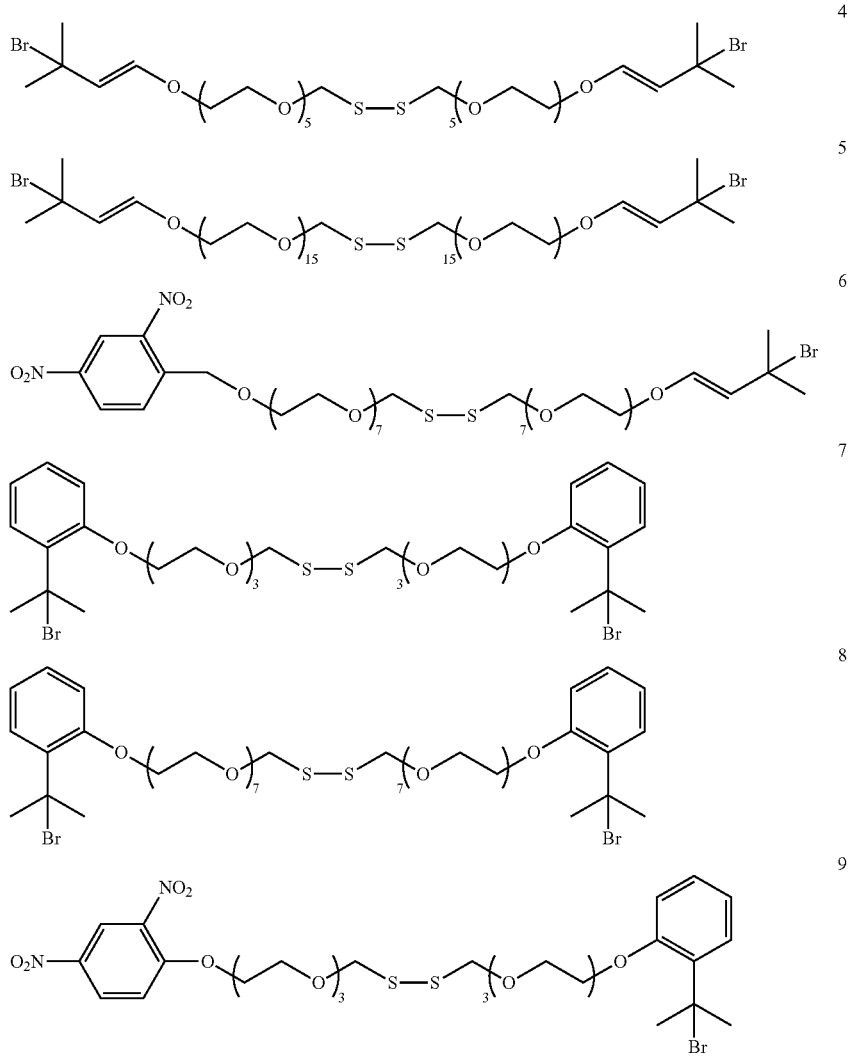

Among them, preferable compounds are those having the structures 1 to 3, which allow efficient movement of electrons. In this manner, since any one of them can be bonded to the substrate in a state of a disulfide compound, the step of deprotection is unnecessary, so that an underlying layer can be easily produced. Additionally, when using the electronic device substrate manufactured in this manner, adequate ionic permeability can be obtained due to a polyether chain spacer. Moreover, using the polymerization initiating group having the structure (I) enables efficient polymerization reaction.

Method for Manufacturing the Compound

Next described will be an example of a method for manufacturing the compound according to the embodiment, described above. The compound according to the embodiment may be manufactured, for example, in a manner illustrated below. The same parts as those in the description concerning the compound will be omitted herein.

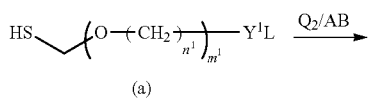

(a)

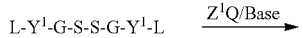

(b)

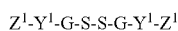

(c)

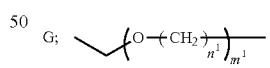

In the above reaction formula, Q represents a halogen atom; $Y^1$ represents one of an oxygen atom, an alkylene group and $—N(R^1)—$, in which $R^1$ represents an alkyl group; $Z^1$ represents a polymerization initiating group; $n^1$ represents an integer from 1 to 4; $m^1$ represents an integer from 1 to 15; L represents a leaving group; A represents an alkali metal; and B represents a base.

A compound (a) is reacted with $Q^2$ (e.g. bromine) in the presence of a base in a solvent to synthesize a symmetrical disulfide compound (b): (Disulfide Group Introduction Step A1). Then, the synthesized compound (b) is reacted with $Z^1Q$ in the presence of a base to produce a compound (c): (Polymerization Initiating group Introduction Step A2). Consequently, as the compound according to the embodiment, there can be obtained the disulfide compound (c), which has a bilaterally symmetrical structure and includes the polymerization initiating group.

Meanwhile, a nonsymmetrical disulfide compound will be synthesized in a manner illustrated below.

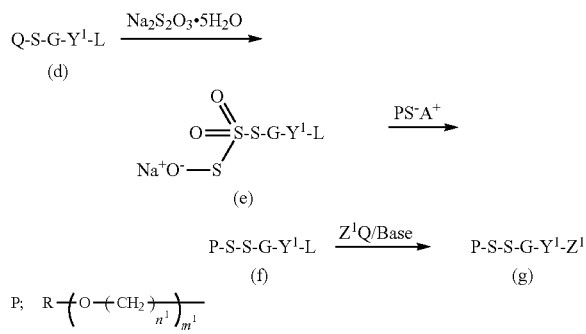

In the above reaction formula, Q represents a halogen atom; $Y^1$ represents one of an oxygen atom, an alkylene group and $—N(R^1)—$, in which $R^1$ represents an alkyl group; $Z^1$ represents a polymerization initiating group; $n^1$ represents an integer from 1 to 4; $m^1$ represents an integer from 1 to 15; L represents a leaving group; and A represents an alkali metal.

A compound (d) is reacted with a sulfurizing agent such as sodium thiosulfate 5-hydrate and thereby the halogen atom in the compound (d) is substituted to synthesize a compound (e). Then, the synthesized compound (e) is reacted with $PS^-A^+$ (See the reaction formula: P is a compound having poly(oxylene) chain which is covalently bonded to S and salified by a base.) to synthesize a disulfide compound (f) having a nonsymmetrical skeleton: (Disulfide Group Introduction Step A1). The synthesized nonsymmetrical disulfide compound (f) is reacted with $Z^1Q$ in the presence of a base to produce a compound (g): (Polymerization Initiating Group Introduction Step A2). Consequently, as the compound according to the embodiment, there can be obtained the compound (g), which is nonsymmetrical disulfide and has the polymerization initiating group.

A1: Disulfide Group Introduction Step

This is a step for converting the thiol compound into disulfide.

In the synthesis of the symmetrical disulfide compound, the compound (a) is reacted with a weak base such as potassium hydrogen carbonate and bromine dispersed in a solvent in a short time under a room temperature. As the result of this, the symmetrical disulfide compound (b) can be obtained.

As used herein, the Q represents a halogen atom such as a bromine atom, a chlorine atom or an iodine atom; the A represents an alkali metal such as sodium or potassium; the B represents a base such as OH—, $CO_2$— or $HCO_2$—; and the L represents a leaving group such as a hydrogen atom.

The base (AB) used for the reaction may be sodium carbonate, sodium hydrogen carbonate, potassium carbonate, potassium hydrogen carbonate, triethylamine, triisopropylamine, sodium ethoxide, sodium hydroxide, potassium hydroxide, tert-butoxy potassium or the like. In the synthesis of the symmetrical disulfide compound, a relatively weak base gives favorable results. Thus, potassium carbonate and potassium hydrogen carbonate are preferable.

An amount of the base to be used is preferably from 1 to 1.5 equivalent with respect to the reactive compound, and more preferably from 1 to 1.2 equivalent with respect thereto. In this manner, the symmetrical disulfide compound (b) can be efficiently synthesized.

Meanwhile, the nonsymmetrical disulfide compound as the stable compound (f) can be obtained by producing the compound (e) from the compound (d) and then reacting the compound (e) with the compound $PS^-A^+$ as thiolate salt. In other words, in this step, the compound (d) as halogenated poly(oxylene) is reacted with the sodium thiosulfate 5-hydrate in the solvent to obtain the compound (e) as Bunte salt which is in turn reacted with the thiolate molecule having a different chain.

In this case, the Q, L and A are the same as those described above.

Preferably, an amount of sodium thiosulfate 5-hydrate to be dropped is in a range of 1 to 2 equivalent with respect to the compound (d), and more preferably 1.2 to 1.8 equivalent with respect thereto.

A preferable reaction solvent may be an aprotic solvent such as dimethylformamide (DMF), dimethylsulfoxide (DMSO) or tetrahydrofuran (THF).

Reaction temperatures vary with reactive substrates, solvents and the like. It is only necessary that the temperature ranges from 40 to 100 degrees centigrade for the compound (d), and preferably it ranges from 50 to 80 degrees centigrade therefor.

Reaction times vary with reactive substrates, solvents and the like. Preferably, the time ranges from 2 to 20 hours for the compound (d) and more preferably from 8 to 15 hours therefor.

In the manner as described above, there can be obtained the compound (e) in which the thiosulfate group has been introduced to the Q of the compound (d).

Furthermore, a description will be given about reaction solvents, reaction time and reaction temperature, which are preferred commonly in the syntheses of the symmetrical and nonsymmetrical disulfide compounds (the synthesis of the compound (b) from the compound (a) and that of the compound (f) from the compound (e)).

Examples of reaction solvents include alcohol solvents such as ethanol and methanol, chloride solvents such as dichloromethane, 1,2-dichloroethane and chloroform, ketone solvents such as acetone and aprotic solvents such as trifluorotoluene (TFT), dimethylacetamide, DMF, DMSO and THF. Any one of them can be used as long as an amount thereof exceeds an amount of a reactive compound.

The reaction temperature varies with reaction substrates, $Q_2$, PSA, reaction solvents or the kinds of the bases. In the syntheses of symmetrical and nonsymmetrical disulfide compounds, it is only necessary to maintain the reaction temperature in a range from 15 to 40 degrees centigrade. Preferably, the temperature ranges from 20 to 30 degrees centigrade.

The reaction time varies with reaction substrates, $Q_2$, PSA, reaction solvents or the kinds of the bases. In the syntheses of symmetrical and nonsymmetrical disulfide compounds, it is only necessary that the reaction time ranges from 1 to 10 hours, and preferably from 2 to 4 hours.

Thus, in the manner as described above, there can be obtained the symmetrical disulfide compound (b) from the compound (a) and the nonsymmetrical disulfide compound (f) from the compound (d), respectively.

A2: Polymerization Initiating Group Introduction Step

This is a step for introducing the polymerization initiating group $Z^1$ to the $Y^1$ of each of the compounds (b) and (f). The compounds (b) and (f) can be obtained by the above step A1.

The $Z^1Q$ is a compound for introducing the polymerization initiating group and the Q is the same as in the above step.

Concrete examples of the $Z^1Q$ include compounds having the following structures (i), (ii) and (iii):

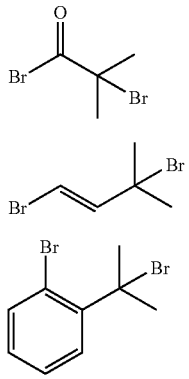

Among them, the compound (i) is preferable because it is easier to handle and allows efficient initiation of polymerization. In this manner, the compounds (c) and (f) (those expressed by the general formula (1)) are preferably used as polymerization initiators.

An amount of the $Z^1Q$ to be used ranges preferably from 2 to 5 equivalent with respect to each of the compounds (b) and (f), and more preferably from 2 to 3 equivalent with respect thereto. In this manner, the polymerization initiating groups can be adequately introduced.

The reaction solvents and bases are the same as those described in the above step A1. In the synthesis of the nonsymmetrical disulfide compound, sodium hydroxide is a preferable base. In addition, an amount thereof to be used is in a range preferably from 2 to 4, and more preferably 2.5 to 3. In this manner, the nonsymmetrical disulfide compound can be efficiently synthesized.

The reaction temperature varies with reaction substrates, $Z^1Q$, reaction solvents and the kinds of the bases. The temperature is preferably from 5 degrees centigrade below zero to 5 degrees centigrade, and more preferably from 2 degrees below zero to 2 degrees centigrade.

The reaction time varies with reaction substrates, $Z^1Q$, reaction solvents and the kinds of the bases. It is only necessary that the time ranges from 3 to 8 hours and more preferably from 5 to 6 hours.

Thus, in the manner as described above, there can be obtained the compounds (c) and (g) (those expressed by the general formula (1)) in which the polymerization initiating group $Z^1$ has been introduced to $Y^1$ of each of the compounds (b) and (f).

The compounds (c) and (g) obtained as above have a covalent bond (according to an Au—S bond) with a metal substrate, for example, with a surface of a gold thin film via disulfide. Then, living polymerization is promoted by the polymerization initiating group formed at a molecular end, so that a polymer film is formed on the metal substrate.

Additionally, in the above A1 step, if $CH_2COCl$ is used to appropriately determine a reaction reagent, a compound can be synthesized in which the S of each of the compounds (a) and (d) has been protected by an acetyl group.

Polymerization Initiator

The compound according to the embodiment, as is obtained above, includes the polymerization initiating group. Thus, the compound can be used by being contained in a polymerization initiator. For example, such a polymerization initiator may contain the compound within a range of 10 to 100 percent by weight and preferably 50 to 100 percent by weight.

The polymerization initiator may also contain various additives such a plasticizer, an antistatic agent and a coloring agent.

Furthermore, since the compound according to the embodiment has the SX group, it can be bonded to a substrate having a metal thereon to be used for an electronic device substrate. In this case, the compound according to the embodiment, which is bonded to the metal of the substrate surface, can be used as an underlying layer. Then, the polymerization initiating group performs graft polymerization, living polymerization, block polymerization or the like of various physiologically active substances and functionalized substances. Accordingly, such an electronic device substrate using the compound can be advantageous for various kinds of sensors including an ion sensor and an organic sensor.

Electronic Device Substrate

Hereinafter, a detailed description will be given of an electronic device substrate according to embodiments of the invention by referring to the drawings.

FIG. 1 is a schematic sectional view of an electronic device substrate 1 according to an embodiment of the invention. In the description below, upper and lower sides in FIG. 1 mean "upper" and "lower" sides, respectively. Additionally, the same parts as those in the description of the compound will not be described below.

The electronic device substrate 1 shown in FIG. 1 includes a substrate 2 and an underlying layer 3 in which the compound expressed by the general formula (1) has been bonded to a surface 21 of the substrate 2 via a sulfur atom.

The structure of each part will now be sequentially explained below.

The substrate 2 supports the underlying layer 3 and/or supplies electricity to a device. In addition, the substrate 2 is configured to have at least one of a metal and a metal oxide on the surface 21 thereof. Then, the at least one of the metal and the metal oxide is bonded to the compound expressed by the general formula (1) via the sulfur atom, so that the underlying layer 3 is laminated on the surface 21 thereof.

Materials of the substrate 2 may be, for example, any one of various kinds of glasses, quartz, silicon, metals such as molybdenum sulfide, copper, zinc, aluminum, stainless steel, magnesium, iron, nickel, gold, silver and platinum, transparent conductive metal oxides such as indium-tin oxide (ITO), indium-zinc oxide (IZO), aluminum-zinc oxide (AZO) and gallium-zinc oxide (GZO), semiconductors such as gallium arsenide and various kinds of plastics.

Among them, metals or metal oxides bondable to the compound expressed by the general formula (1) are preferred. As more bondable materials, gold, silver, platinum, gallium arsenide are more preferable. Particularly, gold is the most preferable because of its firm and stable bonding properties. In this manner, any one of them (particularly gold) can be covalently bonded to the compound expressed by the general formula (1). As a result, the electronic device substrate 1 can include the compound of the general formula (1) that has been stably bonded to the surface 21 of the substrate 2.

When the substrate 2 is made of a material other than a metal and a metal oxide, it is preferable to have at least one of a metal and a metal oxide on the surface 21 thereof. In this manner, the compound of the general formula (1) can be bonded to the at least one of them thereon via the sulfur atom.

In this case, the metal on the surface 21 of the substrate 2 is not specifically limited as long as it can be bonded to the sulfur atom. For example, the metal may be gold, silver, platinum, gallium arsenide or the like. Among them, gold is particularly preferable because it can be firmly bonded to the sulfur atom. In this manner, gold has a covalent bond with the compound of the general formula (1). Therefore, in the electronic device substrate 1 obtained, the compound of the general formula (1) has been firmly and stably bonded to the surface 21 thereof.

Examples of the metal oxide formed on the surface 21 thereof may include transparent conductive oxides such as ITO, IZO, AZO and GZO.

It is only necessary that the substrate 2 has at least one of such a metal and a metal oxide on the surface 21 thereof. Alternatively, both of them may be formed thereon. In order to easily obtain the substrate 2, it is preferable to form one of them on the surface 21, and particularly preferable to have a metal that is easily bondable to the compound of the general formula (1).

The material of the substrate 2 may be a combination of two or more kinds of materials. For example, there may be mentioned a combination of a metal and a metal oxide, a combination of a metal and silicon, a combination of a glass and silicon or the like. Additionally, the metal and the metal oxide disposed on the surface 21 thereof may be a combination of two or more different kinds of them.

A mean thickness of the substrate 2 is not specifically limited. In a case of the substrate 2 made of a metal, a preferable mean thickness thereof ranges approximately from 50 to 200 nm and more preferably approximately from 100 to 150 nm.

When the substrate 2 is made of a material other than metals, the mean thickness thereof preferably ranges approximately from 0.1 to 2,000 nm, and more preferably approximately from 1 to 1,000 nm.

The underlying layer 3 has the compound expressed by the general formula (1). Additionally, the underlying layer 3 is a layer that has been bonded to the at least one of the metal and the metal oxide on the surface 21 thereof via the sulfur atom of the compound. Furthermore, the underlying layer 3 allows bonding, polymerization and lamination of various compounds through the polymerization initiating group $Z^1$ of the compound of the general formula (1).

In the present embodiment, the underlying layer 3 is comprised of only the compound expressed by the general formula (1). However, the layer may also include any other compound as long as it contains the compound of the general formula (1). An amount of the compound of the general formula (1) to be included is preferably equivalent to an amount including it as a main material. More preferably, the amount thereof to be included ranges from 50 to 100 percent by weight and most preferably from 70 to 100 percent by weight. In this manner, the underlying layer 3 can sufficiently include the compound of the general formula (1), so that electrons can be adequately moved.

A mean thickness of the underlying layer 3 varies with a degree of polymerization $m^1$ in the compound expressed by the general formula (1). A preferable mean thickness thereof ranges from 0.5 to 5 nm and more preferably from 1 to 3 nm. In this manner, electrons can be adequately moved.

The underlying layer 3 is preferably configured so as to include a group having the following structure:

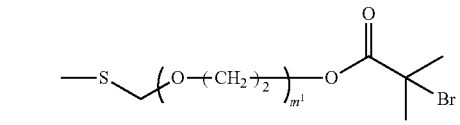

In the above structural formula, $m^1$ is an integer from 1 to 15. In this manner, the electronic device substrate 1 can be easily obtained in which the underlying layer 3 has been firmly and stably bonded to the surface 21 of the substrate 2. Additionally, since —O—$(CH_2)_2$— is used as a spacer, electrons can be more adequately moved (ion penetration).

With the structure as described above, there can be produced the electronic device substrate 1 according to the embodiment. In the electronic device substrate 1, living polymerization is promoted by the polymerization initiator located at the molecular end to form a polymer film. Thus, the electronic device substrate 1 is preferably used as a substrate for an ion sensor, an organic sensor, a biosensor or the like, for example.

Method for Manufacturing the Electronic Device Substrate

Next, a description will be given as to an example of a method for manufacturing the electronic device substrate 1 described above. The same parts as those in the above description will be omitted below.

The electronic device substrate 1 according to the embodiment can be produced, for example, by contacting the substrate 2 having at least one of a metal and a metal oxide on the surface 21 thereof with the underlying layer 3 comprised of a compound expressed by the following general formula (1) to form a metal-sulfur bond on the surface 21 thereof.

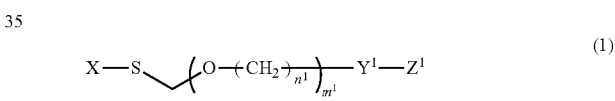

(1)

In the above formula, X represents one of a hydrogen atom and a protecting group; $Y^1$ represents one of an oxygen atom, an alkylene group and —$N(R^1)$—, in which $R^1$ represents an alkyl group; $Z^1$ represents a polymerization initiating group; $n^1$ represents an integer from 1 to 4; and $m^1$ represents an integer from 1 to 15.

When the substrate 2 is made of a material other than the metal and the metal oxide, it is preferable to provide at least one of the metal and the metal oxide on the surface 21. In this case, any one of known methods may be used. For example, there may be used vacuum coating such as sputtering, chemical vapor deposition (CVD) such as plasma CVD, thermal CVD or laser CVD, a dry process such as vacuum evaporation or ion plating, a wet process such as electrolyte plating, immersion plating or electroless plating, a spray process, a sol-gel process, a metal organic decomposition (MOD) process, bonding of a sheet material or the like.

The compound expressed by the general formula (1) may be contacted with the substrate 2 in a manner as follows. For example, the substrate 2 having the at least one of the metal and the metal oxide on the surface 21 thereof will be immersed in a 1-mmol ethanol solution of the compound of the general formula (1) for 1 hour under a room temperature (25 degrees centigrade). Alternatively, spin coating, dip coating, an inkjet method or the like may be used.

Regarding concrete conditions for the contact, a preferable temperature ranges from 10 to 40 degrees centigrade and a preferable time ranges from 1 to 24 hours. More preferably, the temperature and time, respectively, range from 15 to 30 degrees centigrade and 1 to 12 hours, respectively. Under those conditions, the compound of the general formula (1) can be adequately bonded to the surface 21 thereof, so that the underlying layer 3 can be easily formed.

Additionally, the X may be a group expressed by the following formula:

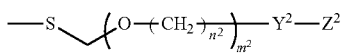

Figure 2:
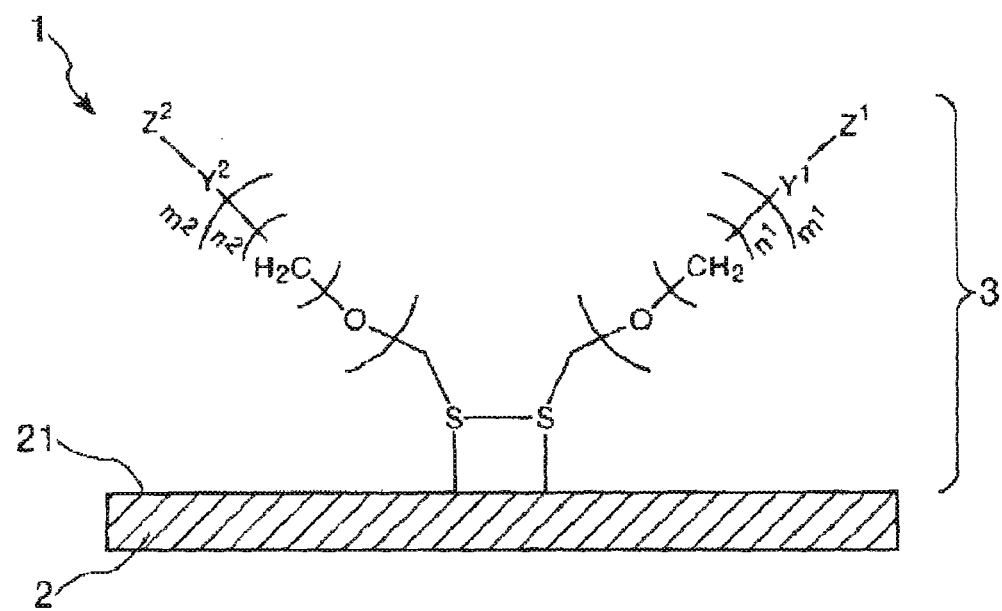
FIG. 2 is a schematic view of an electronic device substrate according to another embodiment of the invention.

In the above formula, $Y^2$ represents one of an oxygen atom, an alkylene group and $—N(R^2)—$, in which $R^2$ represents an alkyl group; $Z^2$ represents a polymerization initiating group; $n^2$ represents an integer from 1 to 4; and $m^2$ represents an integer from 1 to 15. In that case, as shown in FIG. 2, while maintaining a formed S—S bond, the sulfur atom and the at least one of the metal and the metal oxide have a covalent bond (according to the Au—S bond) with each other. In this situation, due to steric hindrance, the compound of the general formula (1) is not closely bonded to the surface 21 of the substrate 2. Thus, the S—S bond will be separated as time passes and the compound structure will change into an upright structure on the substrate 2, as shown in FIG. 1. In this manner, without deprotection of the X in the compound of the general formula (1), the compound thereof (1) can be bonded upright to the substrate 2. Accordingly, the electronic device substrate 1 having high ionic permeability can be easily obtained.

With the method as described above, there can be obtained the electronic device substrate 1 according to the embodiment.

EXAMPLES

1. Manufacturing of the Compound expressed by the General Formula (1).

Example 1

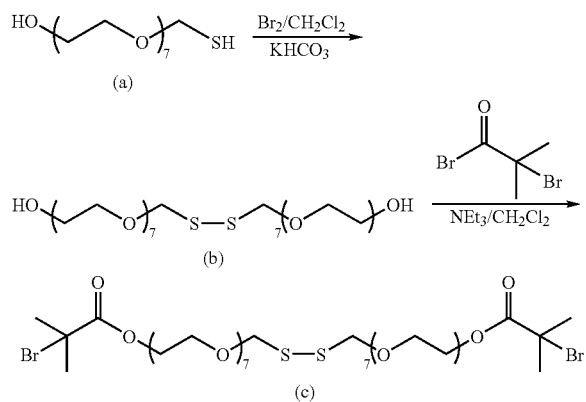

In a round bottom flask, 5 g of polyethylene glycol thiol (a) having a degree of polymerization (n) of 7 was dissolved in 100 ml of dichloromethane and the obtained solution was mixed with 40 ml of 10% aqueous solution of potassium hydrogen carbonate. Then, the mixture solution was stirred (two-layered state) at a room temperature. After dissolving 2.0 g of bromine in 2 ml of ethanol, the solution was added to the mixture solution under stirring. The obtained solution was kept stirring for approximately 1 hour at a room temperature. A brown bromine component was immediately added for reaction and turned to be colorless. Thereafter, a reaction mixture was extracted with dichloromethane to collect a dichloromethane organic layer. After drying the layer with magnesium sulfate, an obtained filtrate was condensed by a low-pressure evaporator to obtain the compound (b) with a yield of 85%. The measurement of a mass spectrometry (MS) spectrum of the obtained compound (b) showed that the compound (b) has a molecular weight of 742.

Next, after dissolving the obtained compound (b) in 100 ml of dichloromethane, the solution was mixed with 40 ml of a 10 aqueous solution of triethylamine and stirred (two-layered state) at a room temperature. Next, 2 g of 2-bromo-2-methyl-ethylbromoketone was dissolved in 2 ml of ethanol and the solution was added to the mixture solution under stirring. The obtained solution was kept stirring for approximately 1 hour at a room temperature. Thereafter, a reaction mixture was extracted with dichloromethane to collect a dichloromethane organic layer. After drying the layer with magnesium sulfate, an obtained filtrate was condensed by the low-pressure evaporator to obtain the compound (c) with a yield of 85%. In the measurement of an MS spectrum of the obtained compound (c), the compound (c) was identified to have a molecular weight of 1040.

Example 2

Example 2 was performed in the same manner as Example 1, except that polyethylene glycol thiol having a degree of polymerization (n) of 3 was used instead of that having the degree of polymerization (n) of 7 in Example 1. Then, with the same yield, a symmetrical disulfide compound was obtained that has a polymerization initiating group having a molecular weight of 688.

Example 3

Example 3 was performed in the same manner as Example 1, except that polyethylene glycol thiol having a degree of polymerization (n) of 11 was used instead of that having the degree of polymerization (n) of 7 in Example 1. Then, with the same yield, a symmetrical disulfide compound was obtained that has a polymerization initiating group having a molecular weight of 1392.

Example 4

Example 4 was performed in the same manner as Example 1, except that 1,3-dibromo-3-methyl-1-butene was used instead of the 2-bromo-2-methyl-ethylbromoketone in Example 1. Then, with the same yield, a symmetrical disulfide compound was obtained that has a polymerization initiating group having a molecular weight of 1036.

Example 5

Example 5 was performed in the same manner as Example 1, except that 1-bromo-2-(2'-bromo-2'-methyl)-ethyl-benzene was used instead of the 2-bromo-2-methyl-ethylbromoketone in Example 1. Then, with the same yield, a symmetrical disulfide compound was obtained that has a polymerization initiating group having a molecular weight of 1136.

2. Manufacturing of the Electronic Device Substrate

Example 6

A gold substrate having a thickness of 100 nm was immersed in a 1-mmol of ethanol solution containing the compound obtained in Example 1 for 1 hour at a room temperature (25 degrees centigrade). Then, ethanol washing and nitrogen drying were performed to obtain an electronic device substrate. In a measurement by the Fourier Transform Infrared (FT-IR) Spectrometer (thermo Nexsus 870 by Nicore Japan Co.), peak positions of functional groups (—O—, —S—, —C=O, etc.) of the compound obtained in Example 1 were observed and thereby bonding of the compound to the substrate surface was confirmed.

Example 7

Example 7 was performed in the same manner as Example 6 to obtain an electronic device substrate, except that the compound obtained in Example 2 was used instead of the compound obtained in Example 1.

Example 8

Example 8 was performed in the same manner as Example 6 to obtain an electronic device substrate, except that the compound obtained in Example 3 was used instead of the compound obtained in Example 1.

Example 9

Example 9 was performed in the same manner as Example 6 to obtain an electronic device substrate, except that the compound obtained in Example 4 was used instead of the compound obtained in Example 1.

Example 10

Example 10 was performed in the same manner as Example 6 to obtain an electronic device substrate, except that the compound obtained in Example 5 was used instead of the compound obtained in Example 1.

Example 11

Example 11 was performed in the same manner as Example 6 to obtain an electronic device substrate, except that a silicon substrate having a thickness of 100 nm and having ITO formed on a surface thereof was used instead of the gold substrate having the same thickness.

Comparative Example 1

Comparative example 1 was performed in the same manner as Example 6 to obtain an electronic device substrate, except that a compound (h) having the following structure was used instead of the compound obtained in Example 1.

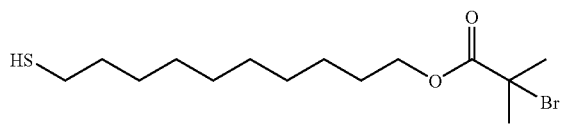

(h)

Comparative Example 2

Comparative example 2 was performed in the same manner as Example 6 to obtain an electronic device substrate, except that a compound (i) having the following structure was used instead of the compound obtained in Example 1.

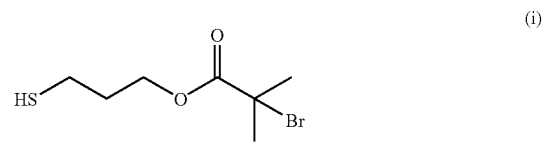

(i)

Although the present invention has been described in detail, it will be apparent to those skilled in the art that the invention may be embodied in a variety of specific forms and that various changes, substitutions and alterations can be made without departing from the spirit and scope of the invention. The described embodiments and examples are only illustrative and not restrictive. The scope of the invention is, therefore, indicated by the following claims.

What is claimed is:

1. An electronic device substrate, comprising:
   a substrate having at least one of a metal and a metal oxide on a surface thereof; and
   an underlying layer having a compound expressed by a following general formula:

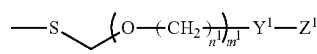

wherein $Y^1$ represents one of an oxygen atom, an alkylene group and $—N(R^1)—$, in which $R^1$ represents an alkyl group; $Z^1$ represents a polymerization initiating group; $n^1$ represents an integer from 1 to 4; and $m^1$ represents an integer from 1 to 15; and
the polymerization initiating group $Z^1$ has one of following structures (II) and (III):

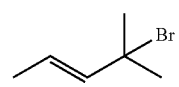

(II)

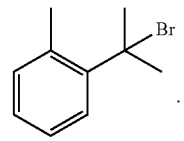

(III)

2. The electronic device substrate according to claim 1, wherein the compound expressed by the general formula is bonded to the at least one of the metal and the metal oxide via a sulfur atom.

3. The electronic device substrate according to claim 1, wherein the metal is one of gold, silver and platinum.

4. The electronic device substrate according to claim 1, wherein the metal oxide is a transparent conductive metal oxide.

5. The electronic device substrate according to claim 1, wherein the $n^1$ of the compound expressed by the general formula is 2.

6. A method for manufacturing an electronic device substrate, comprising:

contacting a compound expressed by a following general formula (1) with a substrate having at least one of a metal and a metal oxide on a surface thereof to form a metal-sulfur bond on the surface thereof, the general formula (1) being as follows:

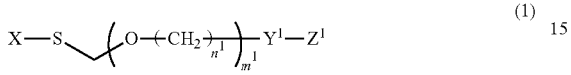
(1)

wherein X represents one of a hydrogen atom and a protecting group; $Y^1$ represents one of an oxygen atom, an alkylene group and —N($R^1$)—, in which $R^1$ represents an alkyl group; $Z^1$ represents a polymerization initiating group; $n^1$ represents an integer from 1 to 4; and $m^1$ represents an integer from 1 to 15; and the polymerization initiating group $Z^1$ has one of following structures (II) and (III):

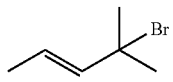
(II)

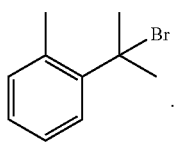
(III)

7. The method for manufacturing an electronic device substrate according to claim 6, wherein the protecting group X of the compound expressed by the general formula (1) is expressed by a following formula:

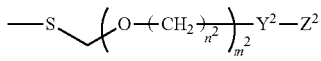

wherein $Y^2$ represents one of an oxygen atom, an alkylene group and —N($R^2$)—, in which $R^2$ represents an alkyl group; $Z^2$ represents a polymerization initiating group; $n^2$ represents an integer from 1 to 4; and $m^2$ represents an integer from 1 to 15.

8. The method according to claim 6, wherein the compound expressed by the general formula (1) is prepared by:

reacting, in the presence of a base, a compound expressed by a following general formula (2) with a compound expressed by a following formula (3), the general formula (2) being as follows:

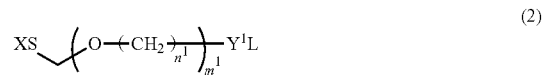
(2)

wherein X represents one of a hydrogen atom and a protecting group; $Y^1$ represents one of an oxygen atom, an alkylene group and —N($R^1$)—, in which $R^1$ represents an alkyl group; L represents a leaving group; $n^1$ represents an integer from 1 to 4; and $m^1$ represents an integer from 1 to 15; and the general formula (3) being as follows:

$Z^1$-Q  (3)

wherein $Z^1$ represents a polymerization initiating group and Q represents a halogen atom.

9. The electronic device substrate according to claim 1, wherein the compound is expressed by a following general formula (1):

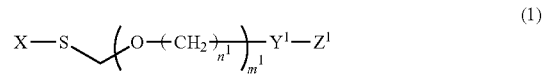
(1)

wherein X represents one of a hydrogen atom and a protecting group; $Y^1$ represents one of an oxygen atom, an alkylene group and —N($R^1$)—, in which $R^1$ represents an alkyl group; $Z^1$ represents a polymerization initiating group; $n^1$ represents an integer from 1 to 4; and $m^1$ represents an integer from 1 to 15; and the polymerization initiating group $Z^1$ has one of following structures (II) and (III):

(II)

(III)

10. An electronic device substrate, comprising:
a substrate having at least one of a metal and a metal oxide on a surface thereof; and
an underlying layer having a compound expressed by a following general formula (1):

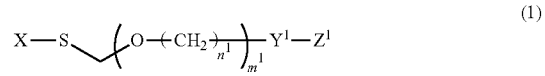
(1)

wherein X represents a protecting group; $Y^1$ represents one of an oxygen atom, an alkylene group and —N($R^1$)—, in which $R^1$ represents an alkyl group; $Z^1$ represents a polymerization initiating group; $n^1$ represents an integer from 1 to 4; and $m^1$ represents an integer from 1 to 15; and the polymerization initiating group $Z^1$ has one of following structures (II) and (III):

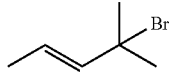
(II)

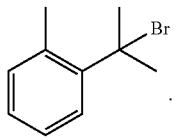
(III)

11. The electronic device substrate according to claim 10, wherein the protecting group X of the compound expressed by the general formula (1) is expressed by a following formula:

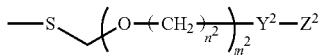

wherein $Y^2$ represents one of an oxygen atom, an alkylene group and —$N(R^2)$—, in which $R^2$ represents an alkyl group; Z represents a polymerization initiating group; $n^2$ represents an integer from 1 to 4; and $m^2$ represents an integer from 1 to 15.

12. An electronic device substrate, comprising:
a substrate having at least one of a metal and a metal oxide on a surface thereof; and
an underlying layer having a compound expressed by a following general formula (1):

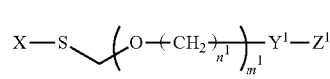
(1)

wherein X represents a protecting group; $Y^1$ represents one of an oxygen atom, an alkylene group and —$N(R^1)$—, in which $R^1$ represents an alkyl group; $Z^1$ represents a polymerization initiating group; $n^1$ represents an integer from 1 to 4; and $m^1$ represents an integer from 1 to 15; and
the protecting group X is expressed by a following formula:

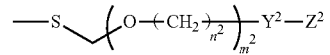

wherein $Y^2$ represents one of an oxygen atom, an alkylene group and —$N(R^2)$—, in which $R^2$ represents an alkyl group; $Z^2$ represents a polymerization initiating group; $n^2$ represents an integer from 1 to 4; and $m^2$ represents an integer from 1 to 15.

* * * * *